(12) United States Patent
Verschuuren et al.

(10) Patent No.: US 10,946,625 B2
(45) Date of Patent: Mar. 16, 2021

(54) COMPOSITION, IMPRINTING INK AND IMPRINTING METHOD

(71) Applicant: KONINKLIJKE PHILIPS N.V., Eindhoven (NL)

(72) Inventors: Marcus Antonius Verschuuren, Berkel-Enschot (NL); Remco Van Brakel, Breda (NL)

(73) Assignee: Koninklijke Philips N.V., Eindhoven (NL)

( * ) Notice: Subject to any disclaimer, the term of this patent is extended or adjusted under 35 U.S.C. 154(b) by 137 days.

(21) Appl. No.: 14/443,181

(22) PCT Filed: Dec. 13, 2013

(86) PCT No.: PCT/IB2013/060930
§ 371 (c)(1),
(2) Date: May 15, 2015

(87) PCT Pub. No.: WO2014/097096
PCT Pub. Date: Jun. 26, 2014

(65) Prior Publication Data
US 2015/0291815 A1    Oct. 15, 2015

(30) Foreign Application Priority Data
Dec. 21, 2012 (EP) .................................. 12198958

(51) Int. Cl.
*B32B 27/00* (2006.01)
*C09D 11/102* (2014.01)
(Continued)

(52) U.S. Cl.
CPC .............. *B32B 27/00* (2013.01); *B32B 3/263* (2013.01); *B32B 27/08* (2013.01); *B32B 27/283* (2013.01);
(Continued)

(58) Field of Classification Search
CPC ....... B82Y 10/00; B82Y 40/00; G03F 7/0002; G03F 7/0755; Y10T 428/24802
(Continued)

(56) References Cited

U.S. PATENT DOCUMENTS

2005/0084613 A1    4/2005  Wang
2008/0167429 A1    7/2008  Satou
(Continued)

FOREIGN PATENT DOCUMENTS

JP    2011082347 A    4/2011
JP    2012211236 A    11/2012
(Continued)

OTHER PUBLICATIONS

George M.C. et al., "Direct Fabrication of 3D Periodic Inorganic Microstructures using Conformal Phase Masks", ® Wiley-VCH Verlag GmbH & Co. KGaA, Weinheim, Angewandte Chemie International Edition 2009, v 48, issue 1, pp. 144-148, Dec. 22, 2008.

*Primary Examiner* — Betelhem Shewareged

(57) ABSTRACT

Disclosed is a silane-based composition for forming an imprinting ink for imprint lithography applications in which the crosslinking of the silanes in the composition is suppressed by the inclusion of a compound of Formula 3: wherein $R_9$ is selected from the group consisting of $C_1$-$C_6$ linear or branched alkyl groups and a phenyl group, and wherein n is a positive integer having a value of at least 2. An ink may be formed by adding a PAG, photoinitiator or TAG to the composition such upon their activation, the crosslinking reaction is completed. An imprinting method using 10 such an ink is also disclosed.

(Continued)

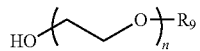

Formula 3

26 Claims, 7 Drawing Sheets

(51) Int. Cl.
*G03F 7/00* (2006.01)
*C09D 11/101* (2014.01)
*C08L 83/04* (2006.01)
*C08L 83/06* (2006.01)
*B82Y 10/00* (2011.01)
*G03F 7/075* (2006.01)
*B82Y 40/00* (2011.01)
*B32B 27/08* (2006.01)
*B32B 27/28* (2006.01)
*B32B 3/26* (2006.01)

(52) U.S. Cl.
CPC .............. *B82Y 10/00* (2013.01); *B82Y 40/00* (2013.01); *C08L 83/04* (2013.01); *C08L 83/06* (2013.01); *C09D 11/101* (2013.01); *C09D 11/102* (2013.01); *G03F 7/0002* (2013.01); *G03F 7/0757* (2013.01)

(58) Field of Classification Search
USPC ....................................................... 428/195.1
See application file for complete search history.

(56) References Cited

U.S. PATENT DOCUMENTS

| | | | |
|---|---|---|---|
| 2009/0186203 A1* | 7/2009 | Takeuchi | B82Y 10/00 428/195.1 |
| 2010/0075108 A1* | 3/2010 | Verschuuren | B82Y 10/00 428/156 |
| 2011/0064925 A1* | 3/2011 | Van Bommel | B82Y 10/00 428/195.1 |
| 2011/0073977 A1* | 3/2011 | Kato | C07B 51/00 257/432 |
| 2011/0189833 A1 | 8/2011 | Sawada | |

FOREIGN PATENT DOCUMENTS

| | | |
|---|---|---|
| WO | WO2008053418 A2 | 5/2008 |
| WO | WO2008104874 A1 | 9/2008 |
| WO | WO2009058545 A2 | 5/2009 |
| WO | WO2209141774 A1 | 11/2009 |
| WO | WO2009147602 A2 | 12/2009 |
| WO | WO2012133432 A1 | 10/2012 |

\* cited by examiner

COMPOSITION, IMPRINTING INK AND IMPRINTING METHOD

FIELD OF THE INVENTION

The present invention relates to a composition for forming an imprinting ink that can be used in imprint lithography applications.

The present invention further relates to an imprinting ink formed from such a composition.

The present invention yet further relates to a method of forming a pattern on a substrate using such an imprinting ink.

BACKGROUND OF THE INVENTION

Imprint lithography is a technique in which a patterned layer such as a masking layer is formed on a substrate such as a semiconductor substrate or as an optical layer by the deposition of a curable imprintable medium. The curable imprintable medium is subsequently patterned by imprinting the medium with a patterned stamp, after which the curable imprintable medium is solidified e.g. when exposed to light, e.g. UV-light to initiate the curing reaction in the medium. After the curing reaction is completed, the stamp is removed from the medium to leave a patterned layer, e.g. on the semiconductor substrate or on a carrier of such an optical layer.

This technique has recently drawn considerable attention because it can potentially provide a significant cost reduction over traditional lithography process steps. The suitability of a curable compound for use in such an imprintable medium is governed by its etch characteristics after formation of the pattern on a carrier such as a semiconductor substrate. For this reason, inorganic sol-gel materials such as alkoxysilanes have proven popular because of their excellent etching resistance and selectivity, excellent adhesiveness and good mechanical and optical properties.

However, these curable solutions suffer from problems that prevent the wide applicability of these compounds in imprint lithography. For instance, for a successful deposition of the inorganic sol-gel material, the solution should be relatively viscous, which can be achieved by partial polycondensation, i.e. gelation, of the alkoxysilanes in the inorganic sol-gel. This however reduces the amount of time that is available for imprinting (the so-called process window) because the initiated polycondensation reaction can rapidly produce a near-solid material that no longer can be imprinted using flexible stamps such as PDMS (polydimethylsiloxane) stamps.

Alternative sol-gel materials have also been considered. For instance, US patent application No. US 2005/0084613 A1 discloses a polymerizable liquid for forming an imprintable layer on a substrate, in which a homo-polymer or co-polymer may be formed from organic or inorganic building blocks. However, the various options of such a liquid layer are not wholly satisfactory. Organic homo-polymers or co-polymers as well as organic/inorganic co-polymers do not exhibit the same excellent etch resistance properties as some inorganic sol-gel materials whereas the inorganic homo- and co-polymers in this document still suffer from a relatively slow curing rate.

M. C. George et al., in Angewante Chemie Internation Edition 2009, 48, pages 144-148, disclose a sol-gel system in which poly(methylsilsesquioxane) is dissolved in a cyclopentanone solution comprising 15 wt % of Rhodorsil 2074 from Rhodia Inc. as a photoacid generator (PAG) and Darocure ITX from Ciba Specialty Chemicals Inc. as a photosensitizer such that the PAG comprises 0.8-1.2% of the total solid content and the molar ratio of sensitizer to PAG was 1.0-1.4. This was demonstrated to be a stable sol-gel system that could be stored for several months without degradation, whilst imprinting could be achieved using UV exposure times of 45-120 seconds.

However, the use of a polymer in such a sol-gel system can be cumbersome and does not always allow for easy modification of the inorganic content of the sol-gel system. It would therefore be preferable to emulate or even improve the above properties in an inorganic sol-gel system in which the inorganic content is monomer-based.

SUMMARY OF THE INVENTION

The present invention seeks to provide an imprinting ink composition in which at least some of the aforementioned drawbacks have been overcome.

The present invention yet further seeks to provide a method of forming a pattern on a substrate using such an imprinting ink composition.

The invention is defined by the independent claims. The dependent claims define advantageous embodiments.

According to an aspect of the present invention, there is provided a composition for forming an imprinting ink, the composition including a dissolved condensation product of at least one of:
a first silane compound of Formula I and a second silane compound of Formula II; and
a compound of Formula 3:

Formula 1

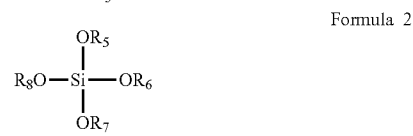

Formula 2

Formula 3 wherein $R_1$-$R_9$ are individually selected from the group consisting of $C_1$-$C_6$ linear or branched alkyl groups and a phenyl group, and wherein n is a positive integer having a value of at least 2; the composition further comprising a protic acid such that the composition has a pH in the range of 3-5 and an organic solvent system comprising a primary or a secondary alcohol and water.

It has surprisingly been found that when adding a compound of Formula 3 to such a sol-gel system, polycondensation of the compounds of Formula 1 and/or 2 can be halted when the pH of the composition is controlled due to the fact that the alcohol ether of Formula 3 acts as an inhibitor of the polycondensation reaction at the defined pH. Consequently, a composition is obtained in which oligomers are formed from the compounds of Formula 1 and/or 2 together with the alcohol ether of Formula 3, such that an imprinting ink formed from the composition has a viscosity that is particularly suited to common deposition techniques such as spin-coating, whilst at the same time providing a wide process window due to the fact that upon the formation of the imprinting ink by the addition of an acid generator such as a photo-acid generator (PAG) or a thermal acid generator (TAG) to further lower the pH of the composition, the polycondensation process is restarted by the removal of the alcohol ether of Formula 3 from the oligomers, which allows the acid-catalyzed polycondensation reaction to complete. This in turn invokes solidification of an imprint ink based on the invention.

Preferably, the dissolved condensation product comprises the first and second silane compounds in a molar ratio of 1:5-5:1. It has been found that when a combination of an alkyl trialkoxysilane and a tetraalkoxysilane in the aforementioned ratio is used to form the polycondensation product, this has the advantage that the amount of crosslinking can be accurately controlled by varying the ratio between the first silane compound and the second silane compound, whilst at the same time obtaining a polycondensation product with a desirable level of crosslinking. Typically, an increase in the ratio towards the first silane compound reduces the crosslinking density in the network formed in the polycondensation reaction. More preferably, the first compound is methyltrimethoxysilane and the second compound is tetramethoxysilane.

The value of n is 2, 3, 4 or 5. It has been found that alcohol ethers of Formula 3 in which n is selected from these values are particularly suitable to inhibit the polycondensation reaction at the specified pH of the composition.

The dissolved condensation product is formed from a silane content in the composition of 1-20 wt % based on the weight of the silanes when fully condensated and a content of Formula 3 in the composition of 1-10 wt % based on the total weight of the composition prior to the formation of said condensation product; the organic solvent system has a content in the composition of 25-98 wt % based on said total weight of the composition; and the photo-acid generator or thermal acid generator has a content in the composition of 1-10 wt % based on the total weight of the dissolved condensation product. It has been found that when the various components of the composition of the present invention are selected within the above ranges, a particularly suitable composition is obtained.

The organic solvent system preferably comprises at least one 1-propanol, 2-propanol, 1-butanol, 2-butanol and 1-methoxy-2-propanol, as it has been found that one or more of these solvents allow the dissolution of the oligomeric condensation product whilst at the same time providing a composition with a low enough volatility to prevent significant evaporation of the solvent system during application and imprinting of the composition on a substrate.

The organic solvent system can further comprise 1-ethoxy-2-(2-ethoxyethoxyl)ethane, as it has been found that the presence of this compound improves the film forming properties of the composition.

The compound of Formula 3 may for instance be selected from diethylene glycol monomethyl ether, diethylene glycol monoethyl ether, triethylene glycol monomethyl ether, triethylene glycol monoethyl ether, tetraethylene glycol monomethyl ether and tetraethylene glycol monoethyl ether.

The composition furthermore can have a water content of 5-20 mole per mole of silicon in said composition. It has been found that when the water content is selected within this range, particularly desirable oligomerization characteristics are obtained.

Preferably, the pH of the composition is in the range of 3.5-4.5 and more preferably is 4. It has been found that at such a pH the desired oligomerization characteristics are obtained. Such a pH may be achieved by addition of any suitable protic acid the composition. Particularly suitable are acetic acid, formic acid and hydrochloric acid (HCl).

The composition may further comprise nanoparticles, e.g. silicon nanoparticles, to reduce shrinkage of a patterned layer formed from the medium.

The composition may further comprise a luminescent compound, e.g. a phosphor or luminescent dye, to facilitate functional modification of a semiconductor substrate carrying light-emitting elements such as light-emitting diodes by the formation of patterned layer portions on the light-emitting elements.

According to another aspect of the present invention, there is provided an imprinting ink including the composition according to one or more embodiments of the present invention, the ink further comprising a photo-acid generator (PAG), thermal acid generator (TAG) or photoinitiator. Such an imprinting ink exhibits an advantageously large process window upon activation of the PAG, TAG or photoinitiator due to the fact that the presence of the compound of Formula 3 retards the polycondensation reaction, which facilitates a better control over the imprinting process as the ink can be imprinted over a longer time interval without affecting reproducibility of the imprinting pattern in the ink.

The photo-acid generator (PAG) can be PAG 103 as manufactured by the BASF company. This PAG is particularly suitable as it can be activated with UV irradiation having a wavelength of at least 350 nm and is capable of removing the compound of Formula 3 from the condensation product, thus reactivating the polycondensation reaction. This is important because at lower wavelengths, stamp materials, in particular rubber stamp materials such as PDMS, can become brittle. The use of near-visible UV of 350 nam and higher wavelength largely reduces or prevents such deterioration of the stamp materials. Hence, such a PAG allows to irradiate the imprint ink through the stamp in stead of through substrate to spare the stamp. Thus the application is largely extended to substrates that are non-transparent for the UV irradiation. The present invention is however not limited to this particular PAG. If stamp integrity is a less critical parameter, for example for stamps that are only used a few times in printing process, a PAG that can be activated at lower wavelength (such as particularly between 250 and 350 nm) can also be used. Furthermore, in that case, as an alternative to a PAG that can be activated at 350 nm or higher wavelength, the composition may for instance further comprise a sensitizing agent for sensitizing the photo-acid generator such that the PAG may be activated using near-visible UV radiation even if the PAG itself does not absorb radiation in this part of the electromagnetic spectrum.

The photo-acid generator or thermal acid generator can have and preferably has a content in the ink of 1-10 wt % based on the weight of the silane compounds when fully condensated.

According to another aspect of the present invention, there is provided a method of forming a patterned layer on a substrate, comprising depositing the imprinting ink of the invention on the substrate; imprinting the deposited imprinting ink with a stamp carrying said pattern; solidifying the imprinting ink by activating the photo-acid generator, or thermal acid generator in said composition; and removing the stamp following said solidification. The use of the imprinting ink of the present invention for an imprinting process, like the one according to the method, has the advantage that a composition having the desired viscosity can be combined with an on-demand completion of the polycondensation of the silane compounds therein, thereby providing improved control over the process window of the printing process.

Said activating step may comprise irradiating the imprinting ink with UV-irradiation having a wavelength of at least 250 nm to activate a photo-acid generator in said ink, which has the advantage of protecting the stamp material from degradation as previously explained. Preferably, the wavelength of the irradiation is at least 350 nm, providing even better protection of the stamp material and facilitating the use of the imprinting ink with imprinting machines that have standard illumination sources providing such UV radiation with wavelengths higher than 350 nm. Often the 250 to 350 nm wavelength part is filtered from the source radiation, like in mask aligner based imprinting machines.

Use of the imprinting ink of any of the claims 14 to 17 for an imprinting process.

Thus, the method and use of the imprinting ink in combination with rubber material based stamps for an imprinting process is advantageous in terms of imprinting characteristics (viscosity and process window), release of the stamp after solidification without damaging the stamp and protection of the stamp during the activation step especially when the imprinting ink is irradiated through the stamp in stead of through the substrate. The stamp may then be made of polydimethylsiloxane rubbers of different kind. Particularly useful PDMS to be used in and imprinting process or method in combination with the imprinting ink of the invention are the ones disclosed in WO2009/147602, which is incorporated by reference herein. A preferred combination would be with a PDMS variant having a composition determined by a row of the table 1 in international patent application with international publication nr. WO2009/147602 chosen from the 6$^{th}$ to 18$^{th}$ row. Such PDMS allows to reproduce patterned features with sizes below 100 nm when the imprinting ink of the invention is used.

The use of the imprinting ink in an imprinting process such as described above provides a substrate that comprises a patterned layer that differs from existing layers. Thus for example, the layer will comprise some remainders of the photo-acid generator, photo-initiator or thermal acid generator and/or the of a compound identified by formula 3, either in free form or as part of the condensation product. however, in spite of the presence of these, the properties of the layer are such that the layer can be used as a functional layer (optical layer (solar cells, or light generating devices such as LEDs or OLEDs) of a device, or as an etch resistant mask layer in further lithographic processes without further processing of the layer that changes its composition.

The layer may be cured afterwards by heating to temperatures higher than 300 to 400 degrees (depending on the exact composition of the constituents of the polycondensation product) to transform the layer into a substantially inorganic layer; i.e a layer without organic content. A polycrystalline siliconoxide layer may be obtained in that way by heating to e.g above 1000 degrees centigrade. And this layer is obtained without a lot of shrinkage. A more detailed description of how to transform such layers with curing and the advantages such layers before and after heating have, is described in international patent application with publication nr WO2008/053418 in general and in particular as of page 16 onwards therein. The WO2008/053418 is incorporated by reference herein.

The novel layers are advantageous as they can be obtained in a way that is cost effective for industry applications due to the process window of the imprinting ink of the invention.

BRIEF DESCRIPTION OF THE EMBODIMENTS

The invention is described in more detail and by way of non-limiting examples with reference to the accompanying drawings, wherein:

FIG. 1 schematically depicts an example of an imprinting method of the present invention;

FIG. 2 schematically depicts another example of an imprinting method of the present invention;

FIG. 3 schematically depicts yet another example of an imprinting method of the present invention;

DETAILED DESCRIPTION OF THE DRAWINGS

Figure 1:
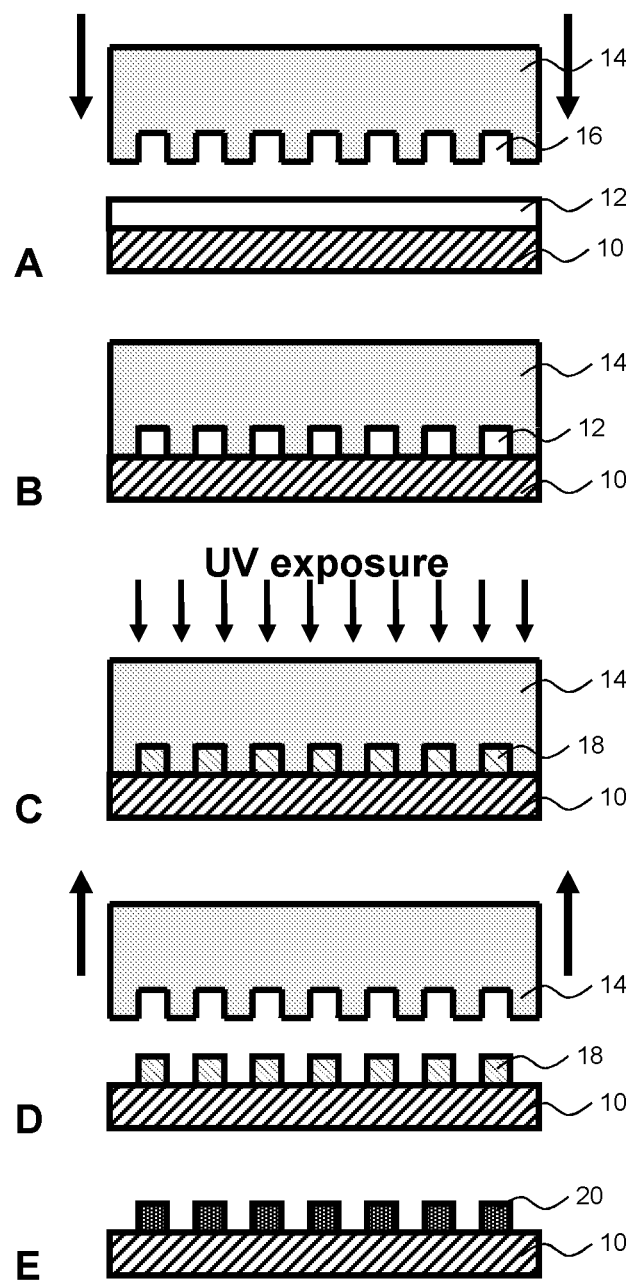

It should be understood that the Figures are merely schematic and are not drawn to scale. It should also be understood that the same reference numerals are used throughout the Figures to indicate the same or similar parts.

In the context of the present application, references are made separately to a composition for forming an imprinting ink and to the imprinting ink itself. The main difference between the composition and the ink is that the ink comprises an acid generator such as a PAG or TAG and/or a photoinitiator, whereas such an acid generator and/or photoinitiator is absent from the composition, e.g. to increase the shelf-life of the composition and to relax its storage requirements as no measures have to be taken to avoid unwanted (premature) activation of the acid generator or photoinitiator.

A composition may be provided as a kit of parts in which the composition is provided as a first part and the acid generator and/or photoinitiator is provided as a second part, e.g. dissolved in a suitable solvent, such as the solvent system used in the composition, such that the imprinting ink may be formed in-situ by mixing the two parts of the kit.

In accordance with the present invention, a sol-gel based composition for forming an imprinting ink and an imprinting ink are provided of which the viscosity can be tuned to give the composition and ink the desired properties for facile deposition of the ink on a substrate, e.g. using spin-coating, doctor blading and so on, and in which the polycondensation of the silane compounds in the ink can be activated on demand, i.e. subsequent to the deposition, to ensure that the process window for imprinting the ink is not reduced by premature polycondensation of the silane compounds in the ink.

Such premature polycondensation may for instance occur if the polycondensation reaction is initiated, e.g. the acid generator or photoinitiator is activated, prior to the deposition process to increase the viscosity of the ink such that the ink can be deposited more easily. However, this significantly reduces the period of time during which the ink can be imprinted by a stamp, as the initiated polycondensation reaction rapidly shifts the ink to a solidified (gelated) state, such that little time is available after its deposition on the substrate to perform the imprinting step before the ink becomes too rigid. This can cause stamp pattern reproducibility problems in the ink, which can negatively affect the yield of the imprinting process.

The present inventors have discovered that it is possible to slow down the polycondensation rate of such a sol-gel system upon activation of the acid generator such as a PAG or TAG or photoinitiator such that premature completion of the polycondensation reaction can be avoided and the process window can be maximized. An additional advantage is that such a polycondensation reaction can be halted at an intermediate polymerization stage, i.e. by the formation of oligomers that remain dissolved in the ink or composition, to give the ink the desired deposition properties, e.g. the desired viscosity, and allows for the polycondensation reaction to be restarted on demand.

To this end, the composition comprises a protic acid to catalyze the polycondensation reaction as well as a polycondensation inhibitor to halt the polycondensation reaction at an intermediate stage. An acid generator, such as a PAG or TAG or a photoinitiator such as Irgacure 369 may be added to the composition prior to the imprinting process to form an imprinting ink, which acid generator has the purpose to further decrease the pH of the ink on demand, e.g. after its deposition on the substrate and while the stamp is imprinted into the ink, to shift the equilibrium between the polycondensation reaction and the hydrolysis reaction towards polycondensation and remove the polycondensation inhibitor from the formed oligomers.

A PAG is preferred as this obviates the need for strict control of the temperatures to which the ink is exposed in case a TAG is used. The ink or the composition including the oligomers can be stored for prolonged periods of time, e.g. several weeks, thus making it particularly suitable for commercial application. The ink may be stored in composition form, i.e. excluding the acid generator and/or photoinitiator, such that no measures have to be taken to avoid premature activation of the acid generator or photoinitiator.

In the reaction to form a sol-gel system, alkoxysilanes may be used which undergo the reaction steps as shown in reaction scheme I in the presence of an acid or a base. Reaction scheme I shows the acid-catalyzed reaction. The alkoxysilanes undergo a hydrolysis, which is followed by a condensation reaction between two hydrolyzed alkoxysilanes (water condensation reaction) or between a hydrolyzed alkoxysilane and an unreacted alkoxysilane (alcohol condensation reaction) in which the crosslinked inorganic network is formed. The degree of crosslinking can be controlled by appropriate choice of the alkoxysilanes.

Reaction Scheme I

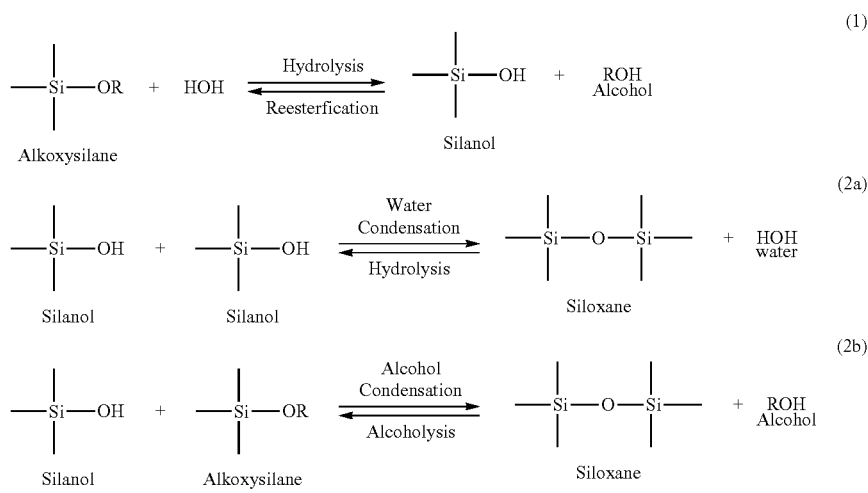

In the above reaction scheme, the equilibrium point between condensation and hydrolysis or alcoholysis can be controlled by the pH of the ink composition. A lower pH, i.e. a more acidic ink composition, will typically shift the equilibrium towards polycondensation. In the invention the ink composition is based on silane monomers of Formula 1, Formula 2 or a combination thereof:

Formula 1

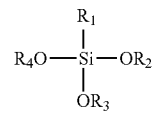

Formula 2

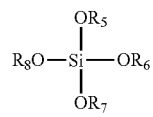

wherein $R_1$-$R_8$ are individually selected from the group consisting of $C_1$-$C_6$ linear or branched alkyl groups and a phenyl group. Particularly suitable examples of such silane compounds are defined by the compounds of Formula 4-7:

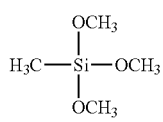

Formula 4

MTMS (methyltrimethoxysilane)

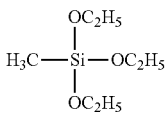

Formula 5

MTES (methyltriethoxysilane)

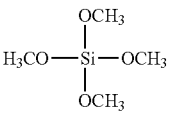

Formula 6

TMOS (tetramethoxysilane)

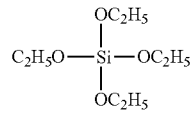

Formula 7

TEOS (tetraethoxysilane)

In an embodiment, the imprintable ink is based on a first silane compound of Formula I and a second silane compound of Formula 2. This has the advantage that the amount of crosslinking can be controlled by varying the ratio between the first and second curable compound. Typically, an increase in the ratio towards the first curable compound reduces the crosslinking density in the network formed in the polycondensation reaction. In order to obtain the most desirable cross-linking density, the molar ratio of the first silane compound and the second silane compound is in the range of 5:1-1:5.

In a particularly suitable embodiment, the first silane compound is MTMS. It has been found that when combining MTMS with a fully inorganic silane compound, i.e. a silane compound according to Formula 2, the unwanted shrinkage of the ink composition upon solidification can be largely avoided. Particularly suitable embodiments of the second silane compounds to be used in combination with MTMS are TMOS and TEOS.

In order to achieve the desired degree of polymerization in the ink composition prior to its deposition, the pH of the ink composition is set in a range of 3-5, preferably 3.5-4.5. Particularly preferable is a pH of about 4. The pH may be set using any suitable protic acid, e.g. an organic acid such as acetic acid or formic acid, or an inorganic acid such as hydrochloric acid.

The ink composition further comprises a polycondensation inhibitor according to Formula 3 that competes with the silane compounds in the polycondensation reaction as shown in Reaction Schedule I:

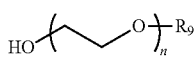

Formula 3 wherein $R_9$ is selected from the group consisting of $C_1$-$C_6$ linear or branched alkyl groups and a phenyl group, and wherein n is a positive integer having a value of at least 2. In a particular advantageous embodiment, n is 2, 3, 4 or 5.

Particularly advantageous examples of the polyethylene glycol monoether of Formula 3 include diethylene glycol monomethyl ether, diethylene glycol monoethyl ether, triethylene glycol monomethyl ether, triethylene glycol monoethyl ether, tetraethylene glycol monomethyl ether and tetraethylene glycol monoethyl ether.

At a pH of 3-5, preferably a pH of 3-5-4.5 and more preferably a pH of around 4, it has been found that a compound of Formula 3 reduces the level of completion of the polycondensation reaction between the silane compounds in the ink or composition, i.e. shifts the equilibrium of the polycondensation reaction more towards the oligomer/monomer side of the equilibrium. In particular, silane oligomers are formed that include the compound of Formula 3.

Although the driving force behind this behavior is not fully understood, it has been established by IR spectroscopy, and NMR spectroscopy that at the specified pH, the alcohol group of the alcohol ether of Formula 3 takes part in an alcohol condensation reaction as shown in Reaction Scheme I, with the ether functionality of the alcohol ether resisting hydrolysis at this stage, thus preventing further polymerization as the hydrolysis reaction (1) in Reaction Scheme I that creates fresh alcohol functional groups facilitating further condensation reactions does not occur. Consequently, the alcohol ether inhibits the further polycondensation of the silane oligomers.

However, upon increasing the acidity of the ink composition, e.g. by the activation of the PAG or TAG, the alcohol ethers are removed from the oligomers, such that the equilibrium of the polycondensation reaction is shifted towards the polymer side of the equilibrium; i.e. the polycondensation reaction can be completed. It has been found that at least in some embodiments this process is at least partly driven by the fact that upon release of the compound of Formula 3 from the silane monomers, the compound is removed from the imprinting ink by diffusion into the stamp material, which further shifts the aforementioned equilibrium towards the polymer products.

At this point, it should be understood that in addition to the oligomers of the silane compounds of Formula 1 and/or Formula 2, embodiments of the ink or composition of the present invention may further comprise the silane compounds of Formula 1 and/or Formula 2 in monomeric form as a consequence of the incomplete polycondensation reaction.

The composition or the curable imprintable ink may further comprise nanoparticles, e.g. silicon nanoparticles, to reduce shrinkage of a patterned layer formed from the medium.

The composition or the curable imprintable ink may further comprise a luminescent compound, e.g. a phosphor or luminescent dye, to facilitate functional modification of a semiconductor substrate carrying light-emitting elements such as light-emitting diodes by the formation of patterned layer portions on the light-emitting elements.

The composition can be converted into an imprinting ink by the addition of an acid generator such as a PAG for lowering the pH to shift the polycondensation reaction equilibrium towards polymer formation as previously explained. In principle, any suitable PAG may be used for this purpose. However, some stamp materials such as PDMS can deteriorate when exposed to deep-UV irradiation, e.g. irradiation of 300 nm or less. It is therefore advantageous when using a PAG that is typically activated at wavelengths below 300 nm to use the PAG in combination with a suitable sensitizer that can be activated above 300 nm, such that degradation of the stamp material can be avoided. For instance, suitable PAGs for use in combination with such sensitizers are PAGs based on iodine salts.

Alternatively, a PAG may be used that can be activated with wavelengths above 300 nm or even above 350 nm without the need for a separate sensitizer. Such sensitizers are known per se, and any suitable sensitizer may be chosen. A non-limiting example of such a PAG includes Irgacure PAG 103:

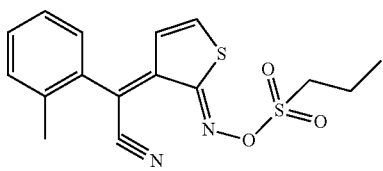

It has furthermore be found that a photo-initiator such as Irgacure 369 may be used instead of a PAG or TAG to accelerate the completion of the photocondensation reaction upon exposure to UV irradiation, such that an ink of the present invention may also be formed by adding such a photo-initiator to the aforementioned composition.

The organic solvent system should be selected such that the formed silane oligomers do not phase separate out of the solution, i.e. remain dissolved, and should have a vapour pressure that is low enough to avoid significant evaporation of the one or more solvents in the solvent system during ink deposition on the substrate, as this can cause premature phase separation of the oligomers, which can deteriorate the quality of the structures formed by the imprinting process, e.g. because homogeneous deposition of the ink becomes problematic. A solvent system including one or more primary and/or secondary alcohols such as 1-propanol, 2-propanol, 1-butanol, 2-butanol and 1-methoxy-2-propanol for instance meets those requirements although it is emphasized that other solvents are expected to be equally suitable.

In an embodiment, the organic solvent system composition has a water content of 5-20 mole per mole of silicon in said composition. It has been found that when the water content is selected within this range, particularly desirable oligomerization characteristics are obtained.

The ink or composition may further comprise one or more additives that do not take part in the polycondensation reaction but may be used to improve the characteristics of the ink or composition. For instance, the ink or composition may contain additives that improve the film forming properties of the ink. A non-limiting example of such an additive is 1-ethoxy-2-(2-ethoxyethoxyl)ethane (EEE):

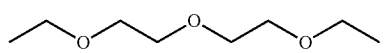

In an embodiment, the ink or composition of the present invention has a composition selected from the ranges as specified in Table I. In Table I, where reference is made to weight percentages (wt %), this is relative to the total weight of the ink or composition unless otherwise specified.

TABLE I

| Compound | Concentration Range |
|---|---|
| Silane monomer(s) of Formula 1 and/or Formula 2 based on the weight of the silanes when fully condensated | 1-20 wt % |
| Water | 5-20 mole per mole of silicon (or 2-40 wt %) |
| Solvent system | 25-98 wt % |
| Polymerization inhibitor of Formula 3 | 1-10 wt % |
| Protic acid | 0.001-0.1 wt % (depending on the pKa of the acid - the amount of acid should set the pH of the composition to around 3-5, e.g. 4) |
| PAG (absent in composition) | 1-10 wt % (based on solid content in ink; i.e. the weight of the silane compounds when fully condensated) |
| Film forming agent (e.g. EEE) | 0-10 wt % |

An embodiment of the method of the present invention is demonstrated in FIG. 1. In step A, a substrate 10, which may be any suitable carrier such as a silicon substrate, a silicon on insulator substrate, a glass substrate and so on, is covered with a layer of a curable imprintable ink 12, i.e. a sol-gel system, of the present invention. A stamp 14, which may be made of any suitable material such as a hard stamp, e.g. from quartz or a soft stamp, e.g. from PDMS carrying a pattern 16 is imprinted into the curable imprintable ink 12, thereby transferring the pattern 16 into this layer, as shown in step B. Next, as depicted in step C, the substrate stack is irradiated with electromagnetic radiation of an appropriate wavelength, e.g. UV radiation, thereby activating a PAG in the ink 12, which removes the alcohol ether from the silane oligomers and thus induces the further polycondensation of the silane oligomers.

Upon completion of this polymerization reaction, the stamp 14 is removed in step D, leaving behind the pattern portions 18 on the substrate 10, which retains its shape due to the network formed by the polycondensation reaction. Next, the remaining pattern may be densified further, e.g. by exposure to heat, thereby forming pattern portions 20 formed of the inorganic polymer resulting from the aforementioned polycondensation reaction as shown in step E.

Figure 4:
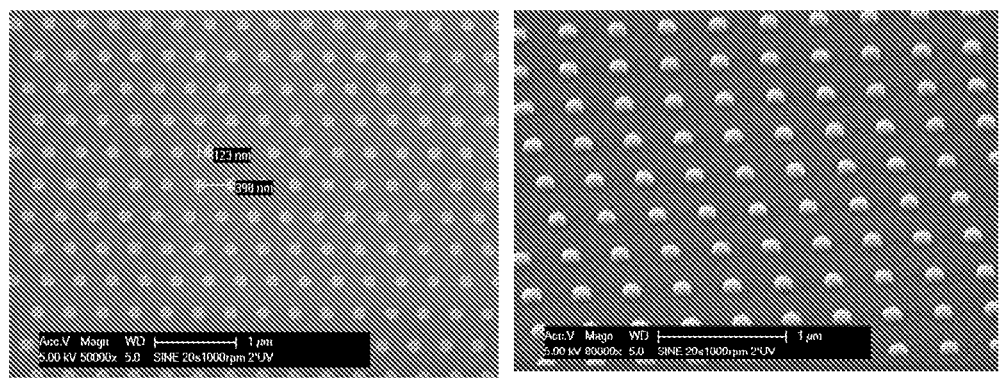
FIG. 4 is a SEM image of an pattern formed using an imprinting method of the present invention.
Figure 5:
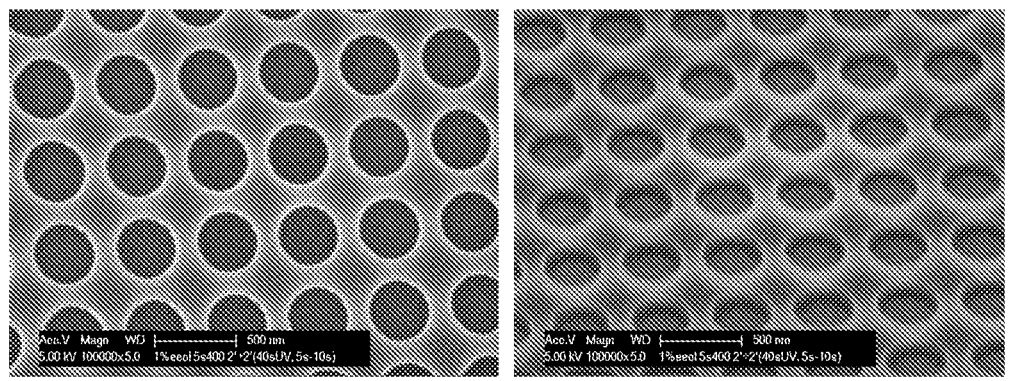
FIG. 5 is a SEM image of another pattern formed using an imprinting method of the present invention.

In a preferred embodiment, the stamp 14 is made of PDMS (polydimethylsiloxane) or another hydrophobic stamp material having a low Young's modulus or being porous. Such materials have the additional advantage that they largely absorb the compound of Formula 3 from the ink composition, which helps to more rapidly shift the condensation/hydrolysis equilibriums shown in Reaction Scheme I towards the polycondensation stage as previously explained. FIGS. 4 and 5 depict SEM images of example patterns that have been formed in the imprinting ink of the present invention using the patterning method of FIG. 1. As will be apparent from these images, submicron features, either raised (FIG. 4) or recessed (FIG. 5) can be formed in the imprinting ink of the present invention with high accuracy and excellent reproducibility.

At this point, it is noted that due to the fact that the curable imprintable ink of the present invention can be used to achieve a cured patterned layer with a high inorganic content and high crosslinking density, the curable imprintable ink of the present invention in particularly being suitable for the formation of multi-layer structures, such as three-dimensional structures that have tuned optical properties, e.g. light emitting diodes, interferometers, photonic crystals and so on. Such structures could not be satisfactorily made with prior art curable media because of the lower inorganic content fraction in the polymers formed from these media, which impaired the structural integrity of the layers formed with these polymers, thus yielding unstable multi-layer structures.

Figure 2:
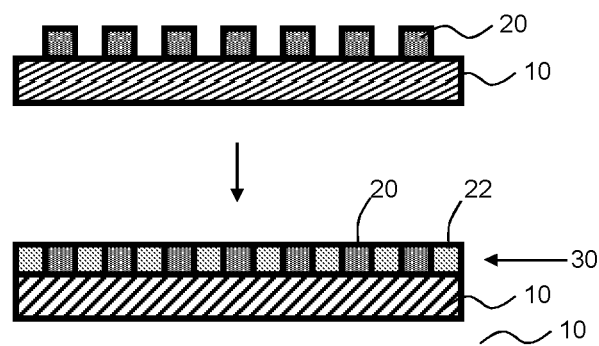

Such three-dimensional structures may be produced by filling or planarizing the patterned layer 20 by depositing a planarization material 22 over the patterned layer 20, as shown in FIG. 2, and removing excess material if necessary, e.g. by etching or polishing. The planarization material 22 may be any thermally degradable material such as a thermally degrable polymer (TDP). A non-limiting example of a TDP is polynorbornene or polystyrene. Alternatively, the planarization material 22 may be soluble in a particular solvent. In general, any planarization material 22 that can be selectively removed from a formed multi-layer structure without damaging the patterned layers formed from the curable imprintable ink of the present invention may be used.

Figure 3:
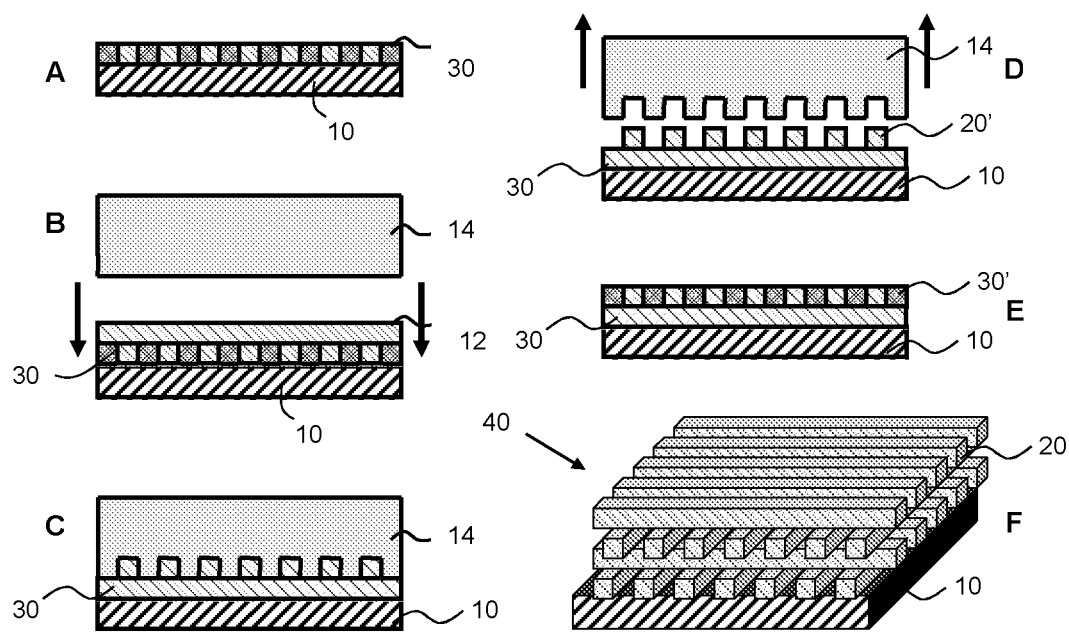

A non-limiting example of a method of manufacturing such a three-dimensional structure is shown in FIG. 3. In step A, a planarized layer 30 is formed on a substrate or carrier 10, as previously explained. The patterned portions 20 of the planarized layer 30 may be produced by UV imprint lithography (e.g. UV-assisted Substrate Conformal Imprint Lithography, UV-SCIL) using the curable imprintable ink 12 in accordance with the method shown in FIG. 1. The pattern 20 is filled, i.e. planarized with a filling material 22. In step B, a next layer of the curable imprintable ink 12 is applied over the planarized layer 30 of step A in any suitable manner, e.g. by spincoating, dispensing or doctor blading.

The curable imprintable ink 12 deposited in step B is subsequently embossed by a suitably patterned stamp 14 after alignment of the stamp with respect to the substrate 10, as shown in step C. In step C, the imprint orientation of the stamp 14 with the substrate 10 has been rotated 90° with respect to the imprint orientation used to form the first patterned layer 20. It will be appreciated that other orientation rotation angles are equally feasible.

The curable imprintable ink 12 is subsequently solidified (densified), e.g. as shown in FIG. 1 to form solidified portions 20' as shown in step D. Obviously, the formation of the solidified portions 20' may be completed after removal of the stamp 14, i.e. by completing the inorganic polymerization reaction as previously discussed. Removing the stamp 14 leaves the densified portions 20' on the planarized layer 30 of step A. The newly formed patterned layer may again be planarized as shown in step E, after which additional layers may be formed by repeating the steps B-E.

The height of the patterned portions of the patterned layer may be reduced using an additional processing step, e.g. by means of reactive ion etching.

The filling material 22 can be removed afterwards by e.g. dissolving the filling material 22 in a suitable solvent or by thermal decomposition, thus yielding a stacked structure as shown in step F. The ink 12 is very suitable for application in this method because it can withstand most solvents required to dissolve the planarization material 22, as well as withstand high temperatures up to 600 or even 1000° C., thereby making it particularly suitable for use with thermally degradable compounds such as a TDP.

In any of the aforementioned embodiments may it be necessary to remove residual imprint structures from e.g. the substrate 10, for instance when a layer on the substrate 10 has been patterned using the imprint structures as a mask.

The imprint structures may be removed by any suitable etching technique, e.g. reactive ion etching.

Figure 6:
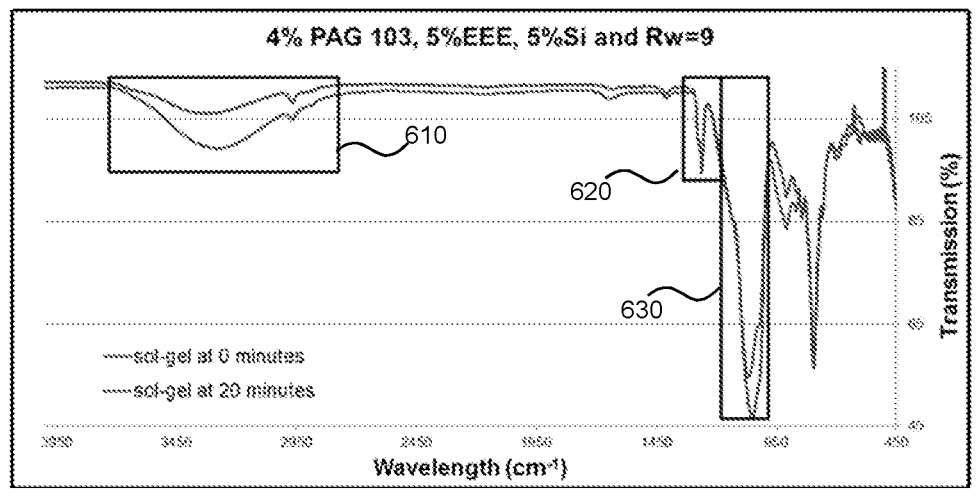
FIG. 6 is an infrared (IR) spectrum of an imprinting ink before and after activation of a PAG in the ink.

FIG. 6 shows an attenuated internal reflection IR spectrum of a 200 nm layer of an imprinting ink layer comprising 2.75 wt % MTMS, 3.07 wt % TMOS, 6.18 wt % water, 0.39 wt % 1M acetic acid, 81.67 wt % 1-propanol, 0.99 wt % of a 10% PAG solution, 3.96 wt % ethylene glycol and 0.99 wt % EEOL on a silicon substrate before and after sol-gel curing, i.e. activation of the PAG 103 using UV irradiation of 350 nm ($R_W$ in FIG. 6 expresses the relative water content expressed in mole water per mole silicon present in the ink). Region 610 depicts the O—H stretch vibration of the Si—OH groups, which diminishes during the curing reaction, as can be expected from the fact that the O—H bonds are being replaced by Si—O—Si bonds, which stretch vibration is shown in region 630, and which shows a distinct increase in intensity during the progress of the curing reaction. Region 620 is attributed to the Si—C stretch vibration of the Si—CH$_3$ groups.

Figure 7:
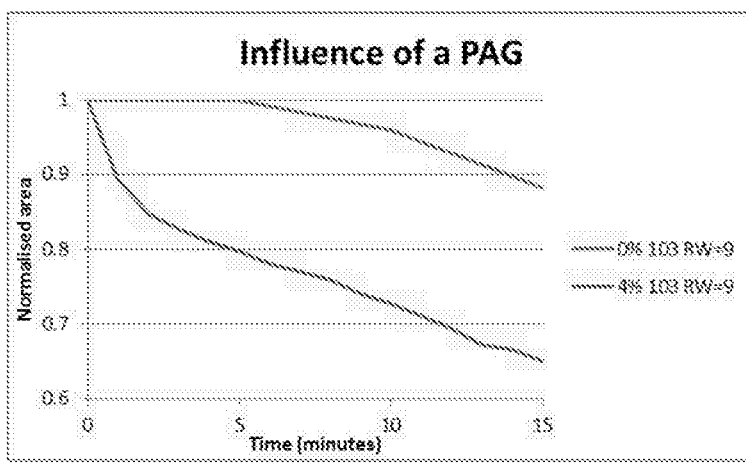
FIG. 7 depicts an aspect of an infrared (IR) spectrum of an imprinting ink with and without a PAG in the ink as a function of time during a curing reaction.

The influence of the presence of the PAG103 in this ink is shown in FIG. 7, which depicts the intensity of the O—H stretch vibration of the Si—OH groups around 3250 cm$^{-1}$ as a function of time in the attenuated internal reflection IR spectrum of a 200 nm imprinting ink layer on a silicon substrate with and without the presence of the 4 wt % PAG 103 in the ink. As will be immediately apparent, the activated PAG103 significantly accelerates the formation of the polycondensation products due to the associated decrease in the pH of the ink, as signaled by the rapid decrease of the intensity of the O—H stretch vibration of the Si—OH groups, which indicates that these groups are being consumed in the polycondensation reaction.

It is noted that even in the absence of the PAG103 the polycondensation reaction eventually progresses, as evidenced by the gradual reduction in the intensity of the O—H stretch vibration of the Si—OH groups in the time interval from 5-15 minutes. This can be explained by the gradual evaporation of solvents and water from the ink layer, and/or by the absorption of the solvents into the stamp, which slowly decreases the pH of the ink as the protic acid in the ink becomes more concentrated. This decrease in pH shifts the equilibrium of the polycondensation reaction towards the polymer products as previously explained. Even if the pH stays constant, e.g. because of the simultaneous slow evaporation of the acid from the ink, the consequential increase of the concentration of the reagents partaking in the polycondensation reaction in the ink will cause the equilibrium of the polycondensation reaction to shift towards the polymer products.

The present invention will now be explained in more detail by way of the following non-limiting examples.

All IR spectra referred to in the present application have been recorded on a Perkin Elmer Spectrum One spectrophotometer.

Preparative Example 1

An imprintable ink is provided comprising 5 wt % TMOS and 5 wt % MTMS, 0.09 wt % acetic acid, 25.4 wt % water, 52 wt % 1-propanol, 2 wt % EEE, 3 wt % EEOL (diethylene glycol monoethyl ether) and 2 wt % PAG 103 with respect to the solid content in the ink by mixing the components of the ink.

Preparative Example 2

An imprintable ink is provided comprising 5 wt % TMOS and 5 wt % MTMS, 0.09 wt % acetic acid, 25.4 wt % water, 39 wt % 1-propanol, 13 wt % 1-butanol, 1 wt % EEOL and 1 wt % PAG 103 with respect to the solid content in the ink by mixing the components of the ink.

Preparative Example 3

An imprintable ink is provided comprising 5 wt % TMOS and 5 wt % MTMS, 0.09 wt % acetic acid, 25.4 wt % water, 16.5 wt % 1-propanol, 38 wt % 1-methoxy-2-propanol, 1 wt % EEOL and 3 wt % PAG 103 with respect to the solid content in the ink by mixing the components of the ink.

Preparative Example 4

An imprintable ink is provided comprising 5 wt % TMOS and 5 wt % MTMS, 0.09 wt % acetic acid, 25.4 wt % water, 16.5 wt % 1-propanol, 38 wt % 1-methoxy-2-propanol, 4 wt % EEE, 1 wt % EEOL and 3 wt % PAG 103 with respect to the solid content in the ink by mixing the components of the ink.

Preparative Example 5

An imprintable ink is provided comprising 2.5 wt % MTMS, 0.09 wt % acetic acid, 25.4 wt % water, 56 wt % 1-propanol, 2 wt % EEOL and 4 wt % PAG 103 with respect to the solid content in the ink by mixing the components of the ink.

Preparative Example 6

An ink is provided as in Preparation Example 1 but for the replacement of EEOL with 1 wt % MEOL (diethylene glycol monomethyl ether).

Preparative Example 7

An ink is provided as in Preparation Example 1 but for the replacement of EEOL with 1 wt % triethylene glycol monomethyl ether.

Preparative Example 8

An ink is provided as in Preparation Example 1 but for the replacement of EEOL with 1 wt % tetraethylene glycol monoethyl ether.

Preparative Example 9

An imprintable ink is provided comprising 5 wt % TMOS and 5 wt % MTMS, 0.09 wt % acetic acid, 25.4 wt % water, 52 wt % 1-propanol, 2 wt % EEE, 3 wt % EEOL (diethylene glycol monoethyl ether) and 4 wt % PAG 103 with respect to the solid content in the ink by mixing the components of the ink.

Comparative Preparative Example 1

An ink is provided as in Preparation Example 1 with the exception that EEOL has been omitted from the ink composition.

Comparative Preparative Example 2

An ink is provided as in Preparation Example 1 but for the replacement of EEOL with 1 wt % ethylene glycol.

Comparative Preparative Example 3

An ink is provided as in Preparation Example 1 but for the replacement of EEOL with 1 wt % 1,2-propanediol.

Comparative Preparative Example 4

An ink is provided as in Preparation Example 1 but for the replacement of EEOL with 1 wt % 2-propoxy-ethanol.

Comparative Preparative Example 5

An ink is provided as in Preparation Example 1 but for the replacement of EEOL with 1 wt % 2-butoxy-ethanol.

Comparative Example 6

An ink is provided as in Preparation Example 9 but for the omission of EEOL and EEE from the ink.

Imprinting Experiment

The ink compositions of Preparative Examples 1-8 and Comparative Preparative Examples have been spun onto a silicon substrate (with native $SiO_2$) by spin-coating for 10 seconds at 500 rpm and 20 seconds at 300 rpm to form an ink film on the glass substrate of approximately 250 nm thickness. The spun film is subsequently imprinted with a patterned PDMS stamp and irradiated with a mercury lamp for about 5 minutes. The PDMS was made as described in international patent application with international publication nr. WO2009/147602 using composition as in any one of rows 6 to 18 of the Table 1 in the reference and using 1,1,3,3-tetramethyl-1,3-divinyl-disiloxane-Pt complex as the Pt catalyst.

The results of the imprinting experiment are summarized in Table II.

TABLE II

| Ink composition | Imprint result (after film spinning) |
|---|---|
| Preparative Example 1 | Ink can be imprinted with PDMS stamp, solidification of pattern after irradiation |
| Preparative Example 2 | Ink can be imprinted with PDMS stamp, solidification of pattern after irradiation |
| Preparative Example 3 | Ink can be imprinted with PDMS stamp, solidification of pattern after irradiation |
| Preparative Example 4 | Ink can be imprinted with PDMS stamp, solidification of pattern after irradiation |
| Preparative Example 5 | Ink can be imprinted with PDMS stamp, solidification of pattern after irradiation |
| Preparative Example 6 | Ink can be imprinted with PDMS stamp, solidification of pattern after irradiation |
| Preparative Example 7 | Ink can be imprinted with PDMS stamp, solidification of pattern after irradiation |
| Preparative Example 8 | Ink can be imprinted with PDMS stamp, solidification of pattern after irradiation |
| Preparative Example 9 | Ink can be imprinted with PDMS stamp, solidification of pattern after irradiation |
| Comparative Preparative Example 1 | Premature cross-linking of ink; too rigid to imprint |
| Comparative Preparative Example 2 | Premature cross-linking of ink; too rigid to imprint |
| Comparative Preparative Example 3 | Premature cross-linking of ink; too rigid to imprint |
| Comparative Preparative Example 4 | Premature cross-linking of ink; too rigid to imprint |
| Comparative Preparative Example 5 | Premature cross-linking of ink; too rigid to imprint |
| Comparative Preparative Example 6 | Premature cross-linking of ink; too rigid to imprint |

From the above, it can be concluded that the ink compositions according to embodiment of the present invention can be stored for prolonged periods of time without excessive crosslinking occurring in the ink composition, whilst at the same time allowing for controlled cross-linking upon activation of the PAG, photoinitiator or TAG therein. More specifically, the inclusion of a polycondensation inhibitor of Formula 3 to the ink composition and the setting of the pH of the ink composition to an appropriate value, excessive cross-linking of the silane compounds can be suppressed during storage of the ink whilst rapid reactivation of the polycondensation, i.e. cross-linking, reaction can be achieved by the activation of the PAG, photoinitiator or TAG in the ink composition, thus providing a stable and versatile ink composition that can be cross-linked on-demand.

Figure 8:
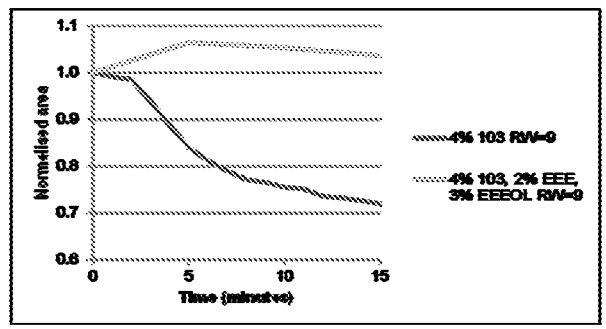
FIG. 8 is an infrared (IR) spectrum of an imprinting ink with and without a compound according to Formula 3 (EEOL) in the ink.

FIG. 8 depicts the intensity of the O—H stretch vibration of the Si—OH groups around 3250 cm$^{-1}$ as a function of time in the attenuated internal reflection IR spectrum of a 200 nm imprinting ink layer according to preparation example 9 and comparative example 6 respectively. As is immediately apparent, the addition of a compound according to Formula 3 (EEOL in this example) significantly reduces the cross-linking or polycondensation speed in the ink.

Figure 9:
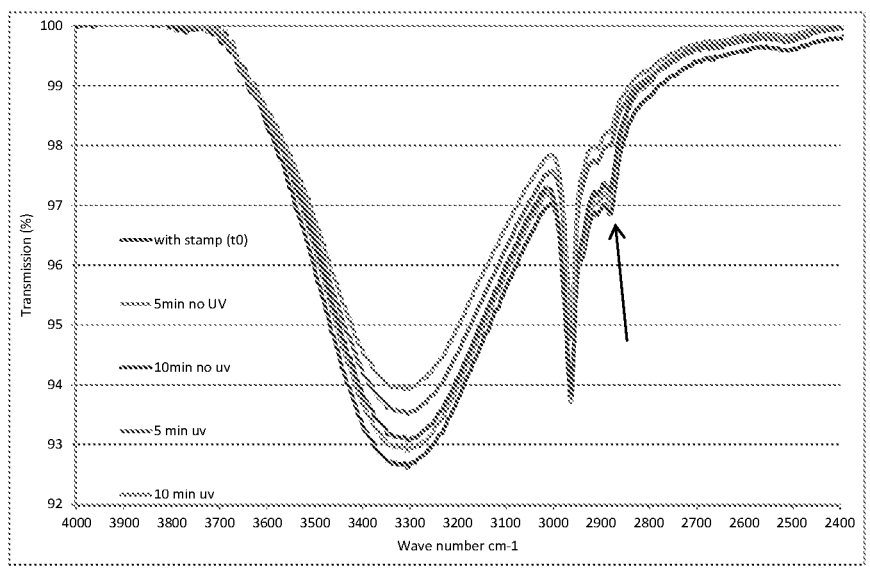
FIG. 9 shows a part of an infrared (IR) spectrum of an imprinting ink according to an example of the present invention at different times during a curing process.
Figure 10:
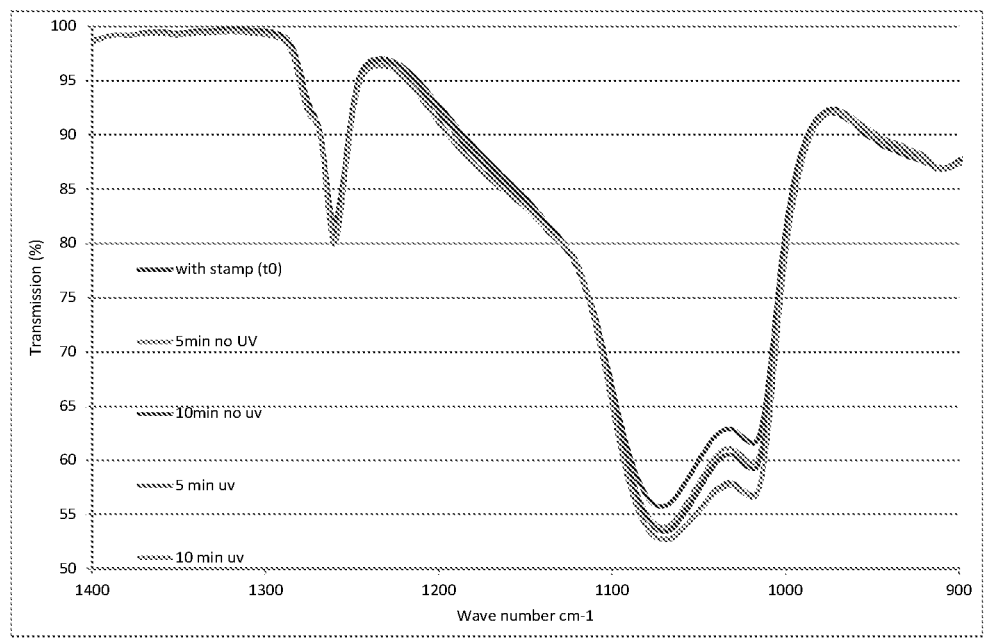
FIG. 10 shows another part of an infrared (IR) spectrum of an imprinting ink according to an example of the present invention at different times during a curing process.

FIG. 9 depicts the intensity of the O—H stretch vibration of the Si—OH groups around 3250 cm$^{-1}$ and a C—H stretch vibration of the EEOL around 2850 cm$^{-1}$ and FIG. 10 depicts the intensity of the Si—O—Si stretch vibration of the polycondensation product around 1100-1000 cm$^{-1}$ as a function of time in the attenuated internal reflection IR spectrum of a 200 nm imprinting ink layer according to preparation example 9.

Figure 11:
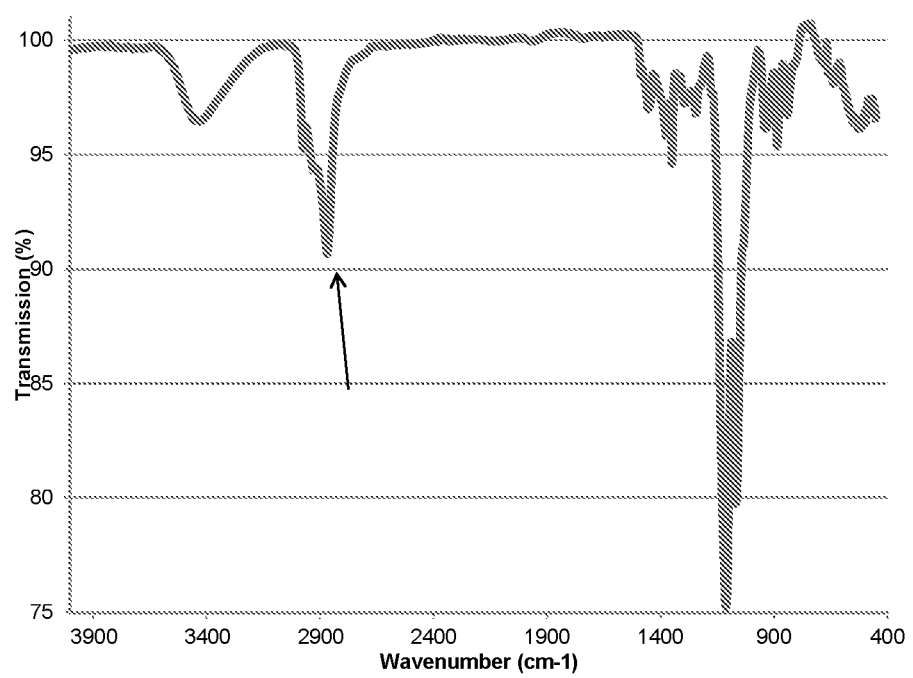
FIG. 11 shows the infrared (IR) spectrum of a compound according to Formula 3 (EEOL).

From the simultaneous reduction in intensity of the O—H stretch vibration of the Si—OH groups around 3250 cm$^{-1}$ and the increase in intensity of the Si—O—Si stretch vibration of the polycondensation product around 1100-1000 cm$^{-1}$ it can be concluded that the Si—OH groups are converted into Si—O—Si groups, indicating a shift in the equilibrium towards the polycondensation product. Interestingly, the decrease in the intensity of the C—H stretch vibration of the EEOL around 2850 cm$^{-1}$ over time not only demonstrates that the EEOL is released from the silane oligomers but furthermore demonstrates that the EEOL is removed from the imprinting ink through diffusion into the stamp material. For the avoidance of doubt, FIG. 11 shows the IR spectrum of EEOL from which it can be unambiguously derived that the stretch vibration at around 2850 cm$^{-1}$ and indicated by the arrows in both FIG. 9 and FIG. 11 originates from EEOL.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:
1. A composition for forming an imprinting ink, the composition comprising:
a dissolved condensation product of:
at least one of a first silane compound of Formula 1 and a second silane compound of Formula 2; and
a compound of Formula 3 acting as an inhibitor of polycondensation reaction of the compounds of Formula 1 or 2 at a defined pH:

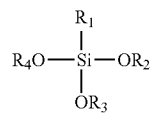

Formula 1

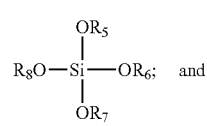

Formula 2

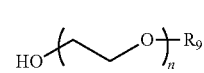

Formula 3 wherein $R_1$-$R_9$ are individually selected from the group consisting of $C_1$-$C_6$ linear or branched alkyl groups and a phenyl group, and wherein n is a positive integer having a value of at least 2;
the composition further comprising:
a protic acid such that the composition has a pH in the range of 3-5; and
an organic solvent system comprising a primary or a secondary alcohol and water wherein the compound of Formula 3 is selected from, triethylene glycol monomethyl ether, triethylene glycol monoethyl ether, tetraethylene glycol monomethyl ether and tetraethylene glycol monoethyl ether.

2. The composition of claim 1, wherein the dissolved condensation product comprises the first and second silane compounds in a molar ratio of 1:5-5:1.

3. The composition of claim 1, wherein n is 2, 3, 4 or 5.

4. The composition of claim 1, wherein:
the dissolved condensation product is formed from a silane content in the composition of 1-20 wt % based on the weight of the silanes when fully condensed and a content of Formula 3 in the composition of 1-10 wt % based on the total weight of the composition prior to the formation of said condensation product; and
the organic solvent system has a content in the composition of 25-98 wt % based on said total weight of the composition.

5. The composition of claim 1, wherein the first compound is methyltrimethoxysilane and the second compound is tetramethoxysilane.

6. The composition of claim 1, wherein the organic solvent system comprises at least one of 1-propanol, 2-propanol, 1-butanol, 2-butanol and 1-methoxy-2-propanol.

7. The composition of claim 6, wherein the organic solvent system further comprises 1-ethoxy-2-(2-ethoxyethoxy)ethane.

8. The composition of claim 1, wherein the composition has a water content of 5-20 mole per mole of silicon in said composition.

9. The composition of claim 1, wherein the pH of the composition is in the range of 3.5-4.5.

10. The composition of claim 1, wherein the protic acid is selected from acetic acid, formic acid and hydrochloric acid (HCl).

11. The composition of claim 1, further comprising nanoparticles.

12. The composition of claim 1, further comprising a luminescent compound.

13. An imprinting ink comprising a composition that includes:
   a dissolved condensation product of:
      at least one of a first silane compound of Formula 1 and a second silane compound of Formula 2; and
      a compound of Formula 3 acting as an inhibitor of polycondensation reaction of the compounds of at least one of Formula 1 and 2 at a defined pH:

$$R_4O-\underset{\underset{OR_3}{|}}{\overset{\overset{R_1}{|}}{Si}}-OR_2 \quad \text{Formula 1}$$

$$R_8O-\underset{\underset{OR_7}{|}}{\overset{\overset{OR_5}{|}}{Si}}-OR_6; \text{ and} \quad \text{Formula 2}$$

$$HO\underbrace{\phantom{xxx}O\phantom{xxx}}_{n}R_9 \quad \text{Formula 3}$$

wherein $R_1$-$R_9$ are individually selected from the group consisting of $C_1$-$C_6$ linear or branched alkyl groups and a phenyl group, and wherein n is a positive integer having a value of at least 2;
the composition further comprising:
   a protic acid such that the composition has a pH in the range of 3-5; and
   an organic solvent system comprising a primary or a secondary alcohol and water, wherein the imprinting ink further comprises one of a photo-acid generator, a photo-initiator and a thermal acid generator and wherein the compound of Formula 3 is selected from, triethylene glycol monomethyl ether, triethylene glycol monoethyl ether, tetraethylene glycol monomethyl ether and tetraethylene glycol monoethyl ether.

14. The imprinting ink of claim 13, wherein the photo-acid generator is

15. The imprinting ink of claim 13, further comprising a sensitizing agent for sensitizing the photo-acid generator.

16. The imprinting ink of claim 13, wherein the photo-acid generator or thermal acid generator has a content in the ink of 1-10 wt % based on the weight of the silane compounds when fully condensed.

17. A method of forming a patterned layer on a substrate, comprising:
   depositing an imprinting ink of claim 13 on the substrate;
   imprinting the deposited imprinting ink with a stamp carrying a pattern;
   solidifying the imprinting ink by activating one of a photo-acid generator, a photoinitiator and a thermal acid generator in said composition; and
   removing the stamp following the solidification.

18. The method of claim 17, wherein said activating of the photo-acid generator or the photoinitiator comprises irradiating the imprinting ink with UV radiation having a wavelength of at least 350 nm.

19. Use of an imprinting ink for an imprinting process, the imprinting ink comprising a composition that includes:
   a dissolved condensation product of:
      at least one of a first silane compound of Formula 1 and a second silane compound of Formula 2; and
      a compound of Formula 3 acting as an inhibitor of polycondensation reaction of the compounds of Formula 1 or 2 at a defined pH:

$$R_4O-\underset{\underset{OR_3}{|}}{\overset{\overset{R_1}{|}}{Si}}-OR_2 \quad \text{Formula 1}$$

$$R_8O-\underset{\underset{OR_7}{|}}{\overset{\overset{OR_5}{|}}{Si}}-OR_6; \text{ and} \quad \text{Formula 2}$$

$$HO\underbrace{\phantom{xxx}O\phantom{xxx}}_{n}R_9 \quad \text{Formula 3}$$

wherein $R_1$-$R_9$ are individually selected from the group consisting of $C_1$-$C_6$ linear or branched alkyl groups and a phenyl group, and wherein n is a positive integer having a value of at least 2;
the composition further comprising:
   a protic acid such that the composition has a pH in the range of 3-5; and
   an organic solvent system comprising a primary or a secondary alcohol and water wherein the compound of Formula 3 is selected from, triethylene glycol monomethyl ether, triethylene glycol monoethyl ether, tetraethylene glycol monomethyl ether and tetraethylene glycol monoethyl ether.

20. The method of claim 17, comprising using a stamp carrying a pattern, wherein a pattern carrying part of the stamp comprises a rubber material.

21. The method of claim 20, wherein the rubber material is a poly-dimethylsiloxane.

22. The method of claim 21, wherein the imprinting ink is irradiated with UV irradiation having a wavelength higher than 250 nm, and wherein irradiation takes place through the stamp.

23. A substrate comprising a patterned layer that is obtainable by performing a method comprising:
   depositing an imprinting ink of claim 13 on the substrate;
   imprinting the deposited imprinting ink with a stamp carrying a pattern;
   solidifying the imprinting ink by activating one of a photo-acid generator, a photoinitiator and a thermal acid generator in said composition; and
   removing the stamp following the solidification.

24. The composition of claim 9, wherein the pH is 4.

25. The composition of claim 11, wherein the particles are silicon nanoparticles.

26. The composition of claim 12, wherein the luminescent compound is a phosphor or luminescent dye.

* * * * *